(12) United States Patent
Dajee et al.

(10) Patent No.: US 7,113,630 B2
(45) Date of Patent: Sep. 26, 2006

(54) PICA SYSTEM DETECTOR CALIBRATION

(75) Inventors: Girish Dajee, San Carlos, CA (US);
Patricia Le Coupanec, Fremont, CA (US); Martin D. Leibowitz, Fremont, CA (US)

(73) Assignee: Credence Systems Corporation, Milpitas, CA (US)

( * ) Notice: Subject to any disclaimer, the term of this patent is extended or adjusted under 35 U.S.C. 154(b) by 531 days.

(21) Appl. No.: 10/079,780

(22) Filed: Feb. 19, 2002

(65) Prior Publication Data

US 2003/0156750 A1   Aug. 21, 2003

(51) Int. Cl.
*G06K 9/00* (2006.01)
(52) U.S. Cl. .............. 382/151; 382/144; 382/145; 382/148; 382/149
(58) Field of Classification Search ............ 382/144, 382/145, 146, 147, 148, 149, 150, 151, 152
See application file for complete search history.

(56) References Cited

U.S. PATENT DOCUMENTS

| | | | |
|---|---|---|---|
| 5,550,960 A * | 8/1996 | Shirman et al. ............ 345/582 |
| 5,796,426 A * | 8/1998 | Gullichsen et al. .... 348/207.99 |
| 5,923,041 A * | 7/1999 | Cresswell et al. ........ 250/491.1 |
| 5,940,545 A | 8/1999 | Kash et al. |
| 5,969,800 A * | 10/1999 | Makinouchi ................. 355/53 |
| 6,028,952 A | 2/2000 | Kash et al. |
| 6,141,460 A * | 10/2000 | Amer et al. ................. 382/257 |
| 6,172,512 B1 | 1/2001 | Evans et al. |
| 6,327,394 B1 * | 12/2001 | Kash et al. .................. 382/280 |
| 6,496,022 B1 * | 12/2002 | Kash et al. .................. 324/752 |
| 6,597,816 B1 * | 7/2003 | Altunbasak et al. ........ 382/275 |
| 6,650,768 B1 * | 11/2003 | Evans et al. ................ 382/145 |
| 6,778,282 B1 * | 8/2004 | Smets et al. ................ 356/614 |
| 6,819,117 B1 * | 11/2004 | Wilsher ...................... 324/601 |

FOREIGN PATENT DOCUMENTS

EP    0 937 989 A2    8/1999

OTHER PUBLICATIONS

J. Bude, *Hot-carrier luminescence in Si*, Phys. Rev. B, 45(11), Mar. 15, 1992, pp. 5848-5856.

(Continued)

*Primary Examiner*—Bhavesh M. Mehta
*Assistant Examiner*—John B. Strege
(74) *Attorney, Agent, or Firm*—Dorsey & Whitney LLP

(57) ABSTRACT

Methods, apparatus and data structures useful in correcting PICA image data are described. An exemplary method comprises acquiring optical image data of a target having identifiable optical-image features, acquiring PICA image data of the target having identifiable PICA-image features corresponding to the optical-image features, matching PICA-image features with corresponding optical-image features, and calculating from matched PICA-image features and optical-image features a set of coefficients defining relationships between observed positions of PICA-image features and optical-image features. Corrections are applied to the observed positions of detected photons based on the coefficients. The coefficients may provide a local correction using a bilinear relationship giving the transformation of a rectangle formed by four features of the PICA-image data to fit a corresponding rectangle in the optical-image data. Alternatively, the coefficients may provide a global mapping function defining transformation of any point of the PICA-image data to fit a corresponding point in the optical-image data.

2 Claims, 19 Drawing Sheets

OTHER PUBLICATIONS

S. Villa et al., *Photon emission from hot electrons in silicon*, Phys. Rev. B, 52(15), Oct. 15, 1995-I, pp. 10993-10999.

J. Kash et al., *Full Chip Optical Imaging of Logic State Evolution in CMOS Circuits*, IEDM 96 Late News Paper (1996) 1, pp. 934-936.

D. Knebel et al., *Diagnosis and Characterization of Timing-Related Defects by Time-Dependent Light Emission*, ITC Proceedings 1998.

M. Bruce et al., *Waveform Acquisition from the Backside of Silicon Using Electro-Optic Probing*, Proceedings from the 25th International Symposium for Testing and Failure Analysis, Nov. 14-18, 1999, pp. 19-25.

S. Polonsky et al., "Non-Invasive timing analysis of IBM G6 microprocessor L1 cache using backside time-resolved hot electron luminescene", 2000 IEEE International Solid-State Circuits Conference, San Francisco, CA, Feb. 7-9, 2000, pp. 222-223.

T. Eiles et al., *Optical Probing of VLSI IC's from the Silicon Backside*, Proceedings from the 25th International Symposium for Testing and Failure Analysis, Nov. 14-18, 1999, pp. 27-33.

M. McManus, *Picosecond Imaging Circuit Analysis of the IBM G6 Microprocessor Cache*, Proceedings from the 25th International Symposium for Testing and Failure Analysis, Nov. 14-18, pp. 35-38.

N. Goldblatt et al., *Unique and Practical IC Timing Analysis Tool Utilizing Intrinsic Photon Emission*, Microelectronics Reliability 41 (2001) 1507-1512.

G. Dajee et al., *Practical, Non-Invasive Optical Probing for Flip-Chip Devices*, ITC Paper 15.3 (Baltimore, Oct. 28,-Nov. 2, 2001) 433-442.

*IDS® PICA, Advanced Optical Imaging for Analysis of 0.13-micron and SOI Devices*, Schlumberger Semiconductor Solutions brochure printed Mar. 2001, four pages.

\* cited by examiner

PICA SYSTEM DETECTOR CALIBRATION

BACKGROUND

1. Field of the Invention

The present invention relates to calibration of detector signals in PICA (picosecond imaging circuit analysis) systems, and particularly to methods, apparatus and data structures useful for calibration of detector signals in PICA systems.

2. Prior Art

New package types, shrinking process geometries and new materials pose challenges for gathering vital data during the integrated circuit (IC) design debug and validation process. Increasingly sensitive devices are easily perturbed during probing, which skews results and slows the design process.

Fault localization methods using beam probe systems are time-consuming even with access to IC layout knowledge since each node must be probed serially to trace the location of a faulty circuit element. Tester and other equipment time is often limited, forcing design debug experts to extract timing measurements from the device one probing session at a time, often adding weeks to the debug and verification cycle.

Data acquisition and analysis can be a development bottleneck. With conventional serial probe systems, skilled IC diagnostic experts are required to analyze the critical device data to know which node to probe next. Though companies often develop multiple products simultaneously, data acquisition, review and analysis capabilities are available only at the probe system's site. If a single node is missed, a new probe session must be set up, effectively limiting progress to one device at a time.

Silicon on insulator (SOI) technology offers increased power capabilities and device performance, but its sensitive structure requires non-invasive probing. Devices manufactured with 0.13-micron geometry have critical signal nodes so small and numerous that the acquisition process is too time-consuming for efficient probe by serial, beam-based instruments.

Picosecond Imaging Circuit Analysis (PICA) technology developed by IBM uses naturally occurring light emission from stimulated CMOS transistors to extract timing measurements and localize faults. Detecting the emitted light with high-speed optical detectors allows circuit switching to be monitored. By imaging and time-resolving light emission from many devices on an operating chip, the flow of information through the chip can be displayed as a movie.

More details of PICA methods and systems are found in the following documents which are incorporated herein by this reference: U.S. Pat. No. 5,940,545 dated Aug. 17, 1999, Kash et al., Noninvasive Optical Method for Measuring Internal Switching and Other Dynamic Parameters of CMOS Circuits; U.S. Pat. No. 6,028,952 dated Feb. 22, 2000, Kash et al., System and Method for Compressing and Analyzing Time-Resolved Optical Data Obtained from Operating Integrated Circuits; U.S. Pat. No. 6,172,512 dated Jan. 9, 2001, Evans et al., Image Processing Methods for the Optical Detection of Dynamic Errors in Integrated Circuits; U.S. Pat. No. 6,304,668 (withdrawn) dated Oct. 16, 2001, Evans et al., Using Time Resolved Light Emission from VLSI Circuit Devices for Navigation on Complex Systems; European patent publication EP 0 937 989 published 25 Aug. 1999, Evans et al., IBM, Using Time Resolved Light Emission from VLSI Circuit Devices for Navigation on Complex Systems; J. BUDE, Hot-carrier luminescence in Si, PHYS. REV. B, 45(11), 15 Mar. 1992, pages 5848–5856; S. VILLA et al., Photon emission from hot electrons in silicon, PHYS. REV. B, 52(15), 15 Oct. 1995-I, pages 10993–10999; J. KASH et al., Full Chip Optical Imaging of Logic State Evolution in CMOS Circuits, IEDM 96 Late News Paper (1996) 1, pages 934–936; D. KNEBEL et al., Diagnosis and Characterization of Timing-Related Defects by Time-Dependent Light Emission, ITC PROCEEDINGS 1998; M. BRUCE et al., Waveform Acquisition from the Backside of Silicon Using Electro-Optic Probing, PROCEEDINGS FROM THE 25$^{TH}$ INTERNATIONAL SYMPOSIUM FOR TESTING AND FAILURE ANALYSIS, 14–18 Nov. 1999, pages 19–25; T. EILES et al., Optical Probing of VLSI IC's from the Silicon Backside, Proceedings from the 25$^{th}$ International Symposium for Testing and Failure Analysis, 14–18 Nov. 1999, pages 27–33; and M. McMCMANUS, Picosecond Imaging Circuit Analysis of the IBM G6 Microprocessor Cache, PROCEEDINGS FROM THE 25$^{TH}$ INTERNATIONAL SYMPOSIUM FOR TESTING AND FAILURE ANALYSIS, 14–18 Nov. 1999, pages 35–38.

Schlumberger Technologies, Inc. of San Jose, Calif. offers commercially its IDS® PICA diagnostic probe system featuring IBM Picosecond Imaging Circuit Analysis technology The system uses PICA technology to detect naturally occurring light emission from stimulated CMOS transistors. Non-invasive capture of inherent signals from device transistors switching enables precise timing measurements and fault localization. The accumulated PICA data is stored for display and/or analysis. The system is capable of probing devices manufactured on advanced processes, including optical imaging for analysis of 0.13-micron and silicon on insulator (SOI) devices.

FIG. 1 shows a schematic block diagram of a PICA system 100 having a PICA frame 105, an electronics rack 110 housing signal acquisition and timing electronics, and a workstation 115 having a display and input devices enabling a user to interact with PICA system 100. A device under test (DUT) 120 is mounted under a test load board 125 which is in turn mounted at the top of PICA frame 105 onto an optical breadboard. Directly under DUT 120 is an objective lens turret 125, with multiple imaging lenses. Lens turret 125 and the rest of the optical system is carried on a motorized xyz stage 130 allowing DUT 120 to remain stationary while the optics are moved. A lens and mirror assembly 135 mounted on the underside of stage 130 allows selection of one of several optical paths. One optical path is for a PICA collection camera 140, a second is for a confocal laser-scanning microscope (LSM) 145 used for device navigation and correlation to CAD data, and a third port is provided for a optional further detector 150.

PICA collection camera 140 converts incident photons into electrical signals, with voltage levels Vx and Vy representing the observed x,y position of a detected photon and a strobe pulse SP synchronized to the time of arrival of the photon regardless of its x,y position. Voltage levels Vx and Vy are supplied to x-position and y-position processing electronics 155, 160 which capture levels Vx and Vy at the time of a strobe pulse SP and convert them to digital position values. The digital position values, along with timing information, are collected in an acquisition module 165 for transfer to workstation 115 where they can be stored, analyzed and displayed. Each detected-photon event can be assigned an address representing its x,y position and time of arrival. Workstation 115 includes a graphical user interface (GUI) and other software allowing the user to control the acquisition of data and subsequent data display and analysis.

The faint infrared emission from switching FETs detected using a single-photon-counting photo-multiplier tube is thus time- and position-resolved A tester 170 stimulates DUT 120 with a repetitive test-vector pattern 175 from a vector output port (vect out). Each repetition of test-vector pattern 175 is marked by a trigger pulse 180 supplied from a trigger output port (trig out) of tester 170 to an input port (trig in) of an event timer 185. A tester clock signal 190 may also be supplied from tester 170 to event timer 185. Event timer 185 measures the delay between a photon arrival event, which can occur at any time within the test-vector pattern, and the start (or end) of the test-vector pattern.

As a device is stimulated by signals applied in a repetitive test loop, the PICA system detects individual photons emitted when a CMOS transistor switches, and records the time and position of each photon. Accumulation of single photon events produces timing and image data which can be compared directly to electrical simulation for electrical analysis. Possible measurements include propagation delay, clock skew and signal tracing across multiple devices from a single probing session. Photon emission data from every node in the field of view over the entire test loop are collected and stored for processing.

FIG. 2 is a simplified schematic view of image-data storage and processing elements in the Schlumberger IDS® PICA probe system. Photon data are transferred from acquisition electronics 165 via a bus to workstation 115, a personal computer running a Windows NT operating system. Probe-system workstation 115 communicates with a Sun Microsystems data-processing workstation 200 running a Solaris operating system via an Orbix interface 205. A GPIB software tool 210 manages the transfer of data between acquisition electronics 165 and a data store 215 in workstation 115. GPIB tool 210 communicates with a navigator tool 225 in workstation 200 which in turn communicates with a transform server 230 in workstation 200. A data server 220 in workstation 115 communicates with transform server 230 to manage the transfer of data between workstations 115 and 200. Transform server 230 places data in two principle stores: an archive file 235 containing x,y,t photon data, APT data and calibration data, and a list file 240 containing x,y,t photon data. A data server 245 communicates with a session tool 250, a channel tool 255, a movie tool 260 and a histogram tool 265. Data server 245 maintains a binary file 265 of x,y,t,n photon data in which the x,y,t data for each photon-arrival event is identified by a number n. For simplicity of illustration, the elements of FIG. 2 are shown as functional blocks. Each of workstations 115 and 200 has the usual hardware elements including a respective processor with associated memory, input/output elements, storage devices, etc., and software elements including an operating system with graphical user interface.

LSM 145 is a high-resolution infrared imaging microscope for generating 512×512-pixel images through the backside of DUT 120. The LSM image is used to navigate around DUT 120, and can be linked to a CAD layout of DUT 120 so that each photon-detection event can be related to the chip architecture and as needed back to the design schematic. The LSM image is also linked to the detection region of the PICA camera. Because they share nearly the same optical path, a single mirror can be used to switch between navigation mode (using the LSM) and data acquisition mode (using the PICA camera).

The PICA camera tends to have a spatial non-linearity, more than the LSM. If the non-linearity is not corrected, a LSM image and a PICA image overlapping in the center of the field of view can be misaligned near the edge of the field of view. In addition to distortion, there are differences in magnification, in rotation and in shift between the LSM image and the PICA image. FIG. 3 illustrates. LSM image 300 is substantially undistorted and can be readily correlated with CAD data to facilitate navigation. PICA image 310 is distorted, so that an arbitrary location 320 in LSM image 300 having coordinates X,Y will correspond to a location 330 having coordinates X+$\Delta$X, Y+$\Delta$Y.

A prior-art solution to this non-linearity employs software to map a correction matrix to compensate for the distortion, by comparing an LSM image and a PICA image of a reticle 400 shown in FIG. 4. Reticle 400 has a large central opening 410 of 600 µm diameter surrounded by a regularly-spaced rectangular grid of smaller openings of 10 µm diameter such as opening 420. Four of the openings in the grid, 430, 440, 450, 460, are crosses of 10 µm line width and 50 µm line length and thus having areas larger than openings 420 and smaller than opening 410.

As shown in FIG. 5, an optical turret 500 allows a calibration assembly 505 to be placed in the optical path 510 of PICA camera 140 and LSM 145. Calibration assembly 505 has an array 515 of light-emitting diodes projecting infrared light through a diffuser 520, through reticle 400, and through an objective 525 so that PICA camera 140 and LSM 145 can acquire images of reticle 400. These images are used to build a correction matrix. As shown in FIG. 6, the correction matrix 600 divides a 512×512 pixel PICA image into 16 cells of 128×128 pixels and provides a $\Delta$X,$\Delta$Y correction value for each cell. The correction $\Delta$X1, $\Delta$Y1 will be applied to pixels in cell 610 (that is, to pixels in the position range of X=0 to 128, Y=0 to 128), the correction $\Delta$X2, $\Delta$Y2 will be applied to pixels in cell 620 (that is, to pixels in the position range of X=128 to 256, Y=0 to 128), and so on. For example, position 26,156 in the LSM image is in cell 5 for which the offset is $\Delta$X5, $\Delta$Y5, so that the corresponding position in the PICA image is 26+$\Delta$X5,156+$\Delta$Y5.

FIG. 7 shows an LSM image 700 and a PICA image 710 of reticle 400. The reticle's openings appear in the LSM image as dark blobs on a light background and in the PICA image as light blobs on a dark background. The PICA image is distorted and rotated relative to the LSM image. A graphical processing library provides functions to find the blobs on the images. The vertical and horizontal translation of the same point in both images is calculated, and an algorithm is provided for interpolating.

FIG. 8 shows a first stage 800 of building a position-correction matrix. The images are prepared for further processing by applying library functions to the images at 805 and the blobs are identified at 810, resulting in a matrix 815 of reticle-opening positions for the LSM image and a matrix 820 of reticle-opening positions for the PICA image. The library functions at 805 include thresholding and inversion 825, 830 and finding all the blobs 835, 840. Identify the blobs 810 involves finding the big blob 845, 850, finding the four cross blobs 855, 860 and identifying the grid points of the reticle 865, 870. Finding the big blob is done by selecting the blob with the biggest area. Finding the four cross blobs is done by locating the blobs of intermediate area and from their orientation; in practice, this is done by an automated process which identifies the blobs according to their respective areas (the central blob having the biggest area, the four crosses having intermediate area, and the remaining grid points having the smallest area), then displaying the image so the user can confirm the central blob and the crosses have been correctly identified or can select them manually. The processor computes the centroid of each identified blob. The expected positions of the reticle's small grid-point blobs are calculated, identified by row and column. The real position of each grid-point blob is found by looking for a blob in a square centered at the expected position.

As shown in the image portion 900 of FIG. 9, the center of the biggest blob 905 is taken as the center of the grid system (location 0,0) and the grid system is oriented with crosses 910, 915, 920, 925. A square region 930 centered on location 3,3 is taken as the search region in which to look for a grid-point blob. A search of region 930 will locate the center point of blob 935, for example. FIG. 10 shows a portion of a resulting grid-point location matrix 1000 along with an image region 1005 represented by the matrix portion 1000. In this example, the grid point 1010 at location −3,4 corresponds to an x,y position of 13,31 and the center point of cross 1015 at location −2,0 corresponds to an x,y position of 58,182.

FIG. 11 shows a second stage of building a correction matrix. The respective matrices 1105 and 1110 of positions of the reticle's holes in the LSM and PICA images are adjusted for size and the values for each point of the matrix are differenced at 1115 to produce a matrix of differences 1120 having the same size as the LSM image and having the same position of the center. The matrix of differences 1120 at this point is a list stored in a two-dimensional array of positions and offset at these positions. With the usual magnification the list has about 200 elements corresponding to the reticle openings, in which one element comprises the position and the corresponding offset.

LSM image 1105 and the matrix of differences 1120 are used to build an incompletely-filled matrix of corrections 1130. A correction matrix is initialized, e.g., 32×32, 128× 128 or 512×512, and the positions given in the LSM matrix position are converted to numbers of rows and columns to start filling the correction matrix 1130. Matrix 1130 incomplete because there are about 200 reticle openings, but a correction matrix of 512×512 points (25,000 values) corresponding to the pixels in the LSM image is desired. The missing values in the incomplete correction matrix 1130 are filled in by linearly interpolating between the known values of the difference matrix 1120 to produce the correction matrix 1140. Other interpolation algorithms considered in the prior art were rejected because they are slower (bicubic) or less flexible (interpolation by pixel line). The interpolated ΔX,ΔY correction value is linearly based on distance from the nearest four surrounding reticle points, as shown at 1200 in FIG. 12, in which $d_i$ is the distance between points $(X_i, Y_i)$ and (X,Y) and where n=4. That is, weighting is done with the four nearest known values because the distortion is local. The search for the four nearest points is limited to a disk centered at the point to be interpolated and having an arbitrary radius; if a know point is found in this area, the search is repeated with a larger radius (the previous is multiplied by 2).

FIG. 13 is a screen display 1300 showing the detection of reticle points, in which each grid point such as point 1310 is marked with a cross and the four crosses 1320, 1330, 1340, 1350 of the reticle are outlined with boxes for ease of viewing. FIG. 14 shows an example of an LSM reticle image 1410, a PICA reticle image 1420 and processed PICA image 1430 which has been modified using a correction matrix prepared as just described.

A disadvantage of the prior art calibration described above is that the correction matrix produces a corrected PICA image having undesirable and troublesome discontinuities. Improved correction of PICA data is needed during real-time data acquisition so as to produce better PICA images, yet without incurring excessive processing overhead.

SUMMARY OF THE INVENTION

In accordance with embodiments of the invention, methods are provided for correcting PICA image data, comprising: acquiring optical image data of a target having identifiable optical-image features, acquiring PICA image data of the target having identifiable PICA-image features corresponding to the optical-image features, matching PICA-image features with corresponding optical-image features, and calculating from matched PICA-image features and optical-image features a set of coefficients defining relationships between observed positions of PICA-image features and optical-image features. The methods may comprise acquiring PICA image data of a specimen including observed positions of detected photons, and applying corrections to the observed positions based on the set of coefficients.

Calculating a set of coefficients may comprise calculating coefficients defining a local correction for each of a plurality of regions of the PICA-image data. Calculating a set of coefficients comprises solving a bilinear relationship giving the transformation of a rectangle formed by four features of the PICA-image data to fit a corresponding rectangle in the optical-image data. The bilinear relationship may express the corrected coordinates $(cx_n, cy_n)$ for the $n^{th}$ point of M points in the rectangle as a function of the corresponding observed coordinates $(x_n, y_n)$. The coefficients may be stored in a file having a pair of coefficients $(a_{ij}, b_{ij})$ for each of a plurality of rectangles. Alternatively, calculating a set of coefficients may comprise calculating coefficients of a global mapping function defining transformation of any point of the PICA-image data to fit a corresponding point in the optical-image data. The global mapping function may comprise a pair of bivariate polynomials, e.g., of degree one or two.

Matching PICA-image features with corresponding optical-image features may comprise subtracting background from the optical-image data. Matching PICA-image features with corresponding optical-image features may comprise: preparing optical-image-background data by applying gray-scale erosion to the optical-image data, subtracting optical-image-background data from the optical-image data to produce flattened-optical-image data have lesser intensity gradients than the optical-image data and matching PICA-image features with corresponding features of the flattened-optical-image data.

Embodiments in accordance with the invention provide apparatus for preparing corrected PICA image data, comprising: an optical microscope for acquiring optical image data of a target having identifiable optical-image features, a PICA camera for acquiring PICA image data of the target having identifiable PICA-image features corresponding to the optical-image features, and data processing equipment having instructions for matching PICA-image features with corresponding optical-image features, and calculating from matched PICA-image features and optical-image features a set of coefficients defining relationships between observed positions of PICA-image features and optical-image features. The data processing equipment may further comprise instructions for applying corrections to the observed positions of photons detected by the PICA camera based on the set of coefficients.

The data processing equipment may comprise instructions for calculating the coefficients to define a local correction for each of a plurality of regions of the PICA-image data. The data processing equipment may comprise instructions for calculating the set of coefficients by solving a bilinear relationship giving the transformation of a rectangle formed by four features of the PICA-image data to fit a corresponding rectangle in the optical-image data. The bilinear relationship may express the corrected coordinates ($cx_n$, $cy_n$) for the $n^{th}$ point of M points in the rectangle as a function of the corresponding observed coordinates ($x_n$, $y_n$). The apparatus may comprise a data storage medium for storing the coefficients in a file having a pair of coefficients ($a_{ij}$, $b_{ij}$) for each of a plurality of rectangles.

The data processing equipment may comprise instructions for calculating coefficients of a global mapping function defining transformation of any point of the PICA-image data to fit a corresponding point in the optical-image data. The global mapping function may comprise a pair of bivariate polynomials of degree one or more, e.g., of degree two or three. The data processing equipment may comprise instructions for matching PICA-image features with corresponding optical-image features may comprise instructions for subtracting background from the optical-image data, e.g., by preparing optical-image-background data by applying gray-scale erosion to the optical-image data, subtracting optical-image-background data from the optical-image data to produce flattened-optical-image data have lesser intensity gradients than the optical-image data, and matching PICA-image features with corresponding features of the flattened-optical-image data.

Embodiments in accordance with the invention may provide a data structure stored in a tangible data-storage medium comprising a set of coefficients defining relationships between observed positions of features in PICA-image data and corresponding features in optical-image data. The set of coefficients may define a bilinear relationship giving the transformation of a rectangle formed by four features observed in the PICA-image data to fit a corresponding rectangle in an image formed with the optical-image data. The data structure may compare a pair of coefficients ($a_{ij}$, $b_{ij}$) for each of a plurality of rectangles. Alternatively, the coefficients may define a global mapping function for transforming any point of the PICA-image data to fit a corresponding point in the optical-image data. The global mapping fiction may comprise a pair of bivariate polynomials. The global mapping function may comprise a pair of bivariate polynomials of degree one or more, e.g., of degree two or three.

These and other features of embodiments in accordance with the invention will become apparent to those of skill in the art from the following description and the accompanying drawing figures.

DETAILED DESCRIPTION

Incorporated by this reference are the following additional documents describing optical probing: G. DAJEE et al., *Practical, Non-Invasive Optical Probing for Flip-Chip Devices*, ITC INTERNATIONAL TEST CONFERENCE, Paper 15.3, 2001, pages 433–442; and N. GOLDBLATT et al., *Unique and Practical IC Timing Analysis Tool Utilizing Intrinsic Photon Emission*, MICROELECTTONICS RELIABILITY 41 (2001) 1507–1512.

Embodiments of methods, apparatus and data structures for calibration of PICA detector data in accordance with the invention will now be described.

The Need for Image Registration

Figure 1:
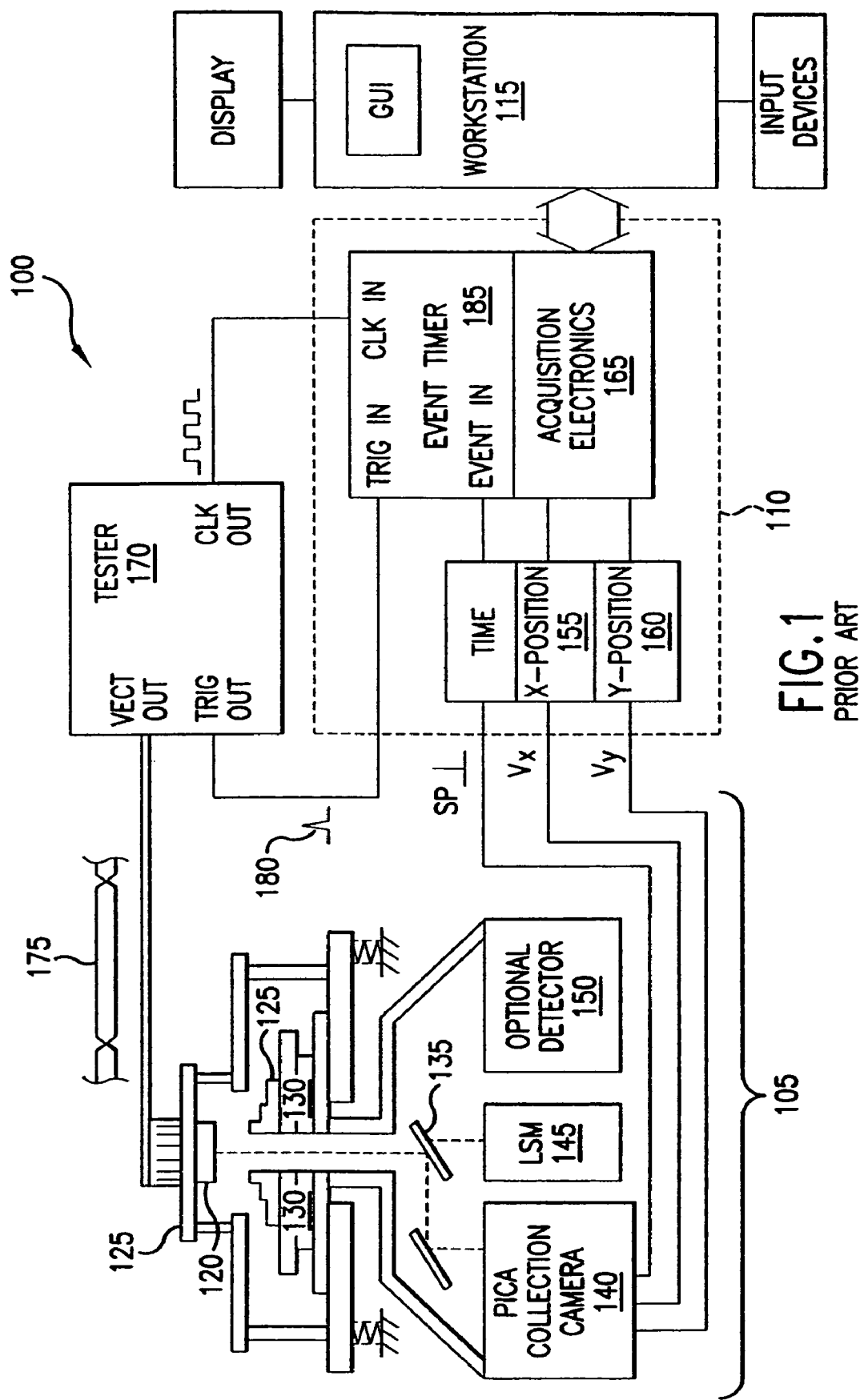
FIG. 1 shows a schematic block diagram of a PICA system.
Figure 2:
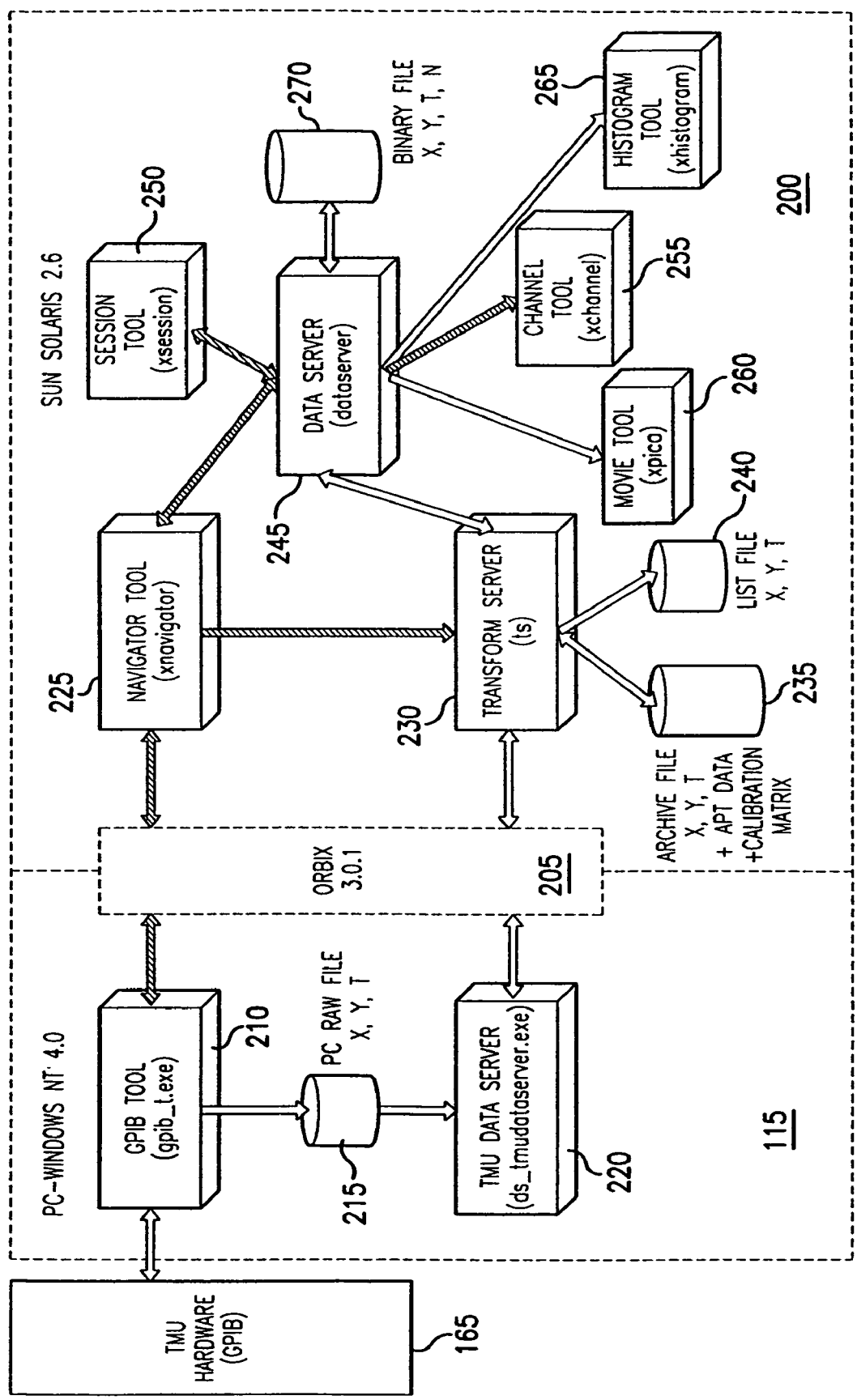
FIG. 2 is a simplified schematic view of image-data storage and processing elements in a Schlumberger IDS® PICA probe system.
Figure 3:
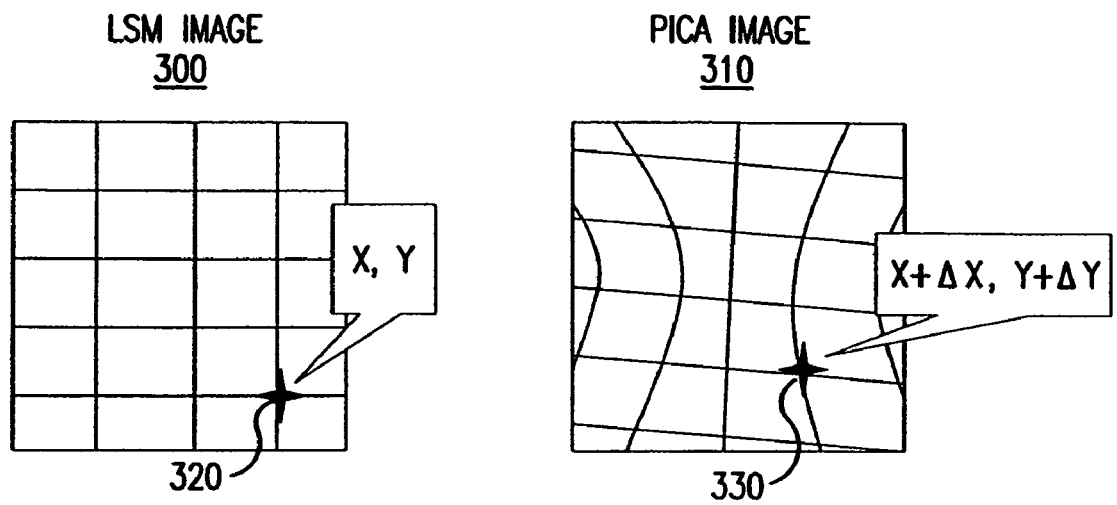
FIG. 3 illustrates the spatial non-linearity of a PICA image relative to an LSM image.

Picosecond Imaging Circuit Analysis (PICA) is an optical technique for non-invasive probing of Flip-Chip devices. As described above with respect to FIG. 1, the Schlumberger IDS® PICA system combines a confocal Laser Scanning Microscope (LSM) 145 and a PICA collection camera 140 with an infrared single-photon-counting detector for imaging and probing. The LSM measures reflected-beam intensity from the DUT 120 from which an image of the device is generated. The faint emission from switching FETs is time- and position-resolved using a single-photon-counting photo-multiplier tube. For probing purposes, the infrared emission from the DUT, imaged using the signal from the PICA camera 140, must be precisely overlaid on the LSM image to define accurately the probing area or confirm the origin of the photons.

Figure 4:
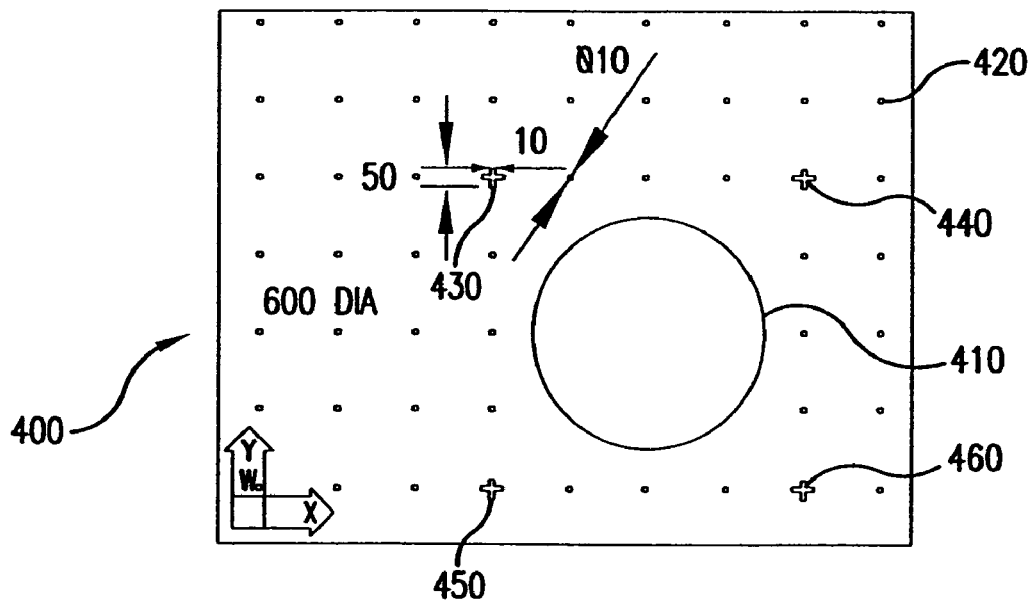
FIG. 4 shows the openings of a prior-art calibration reticle.
Figure 5:
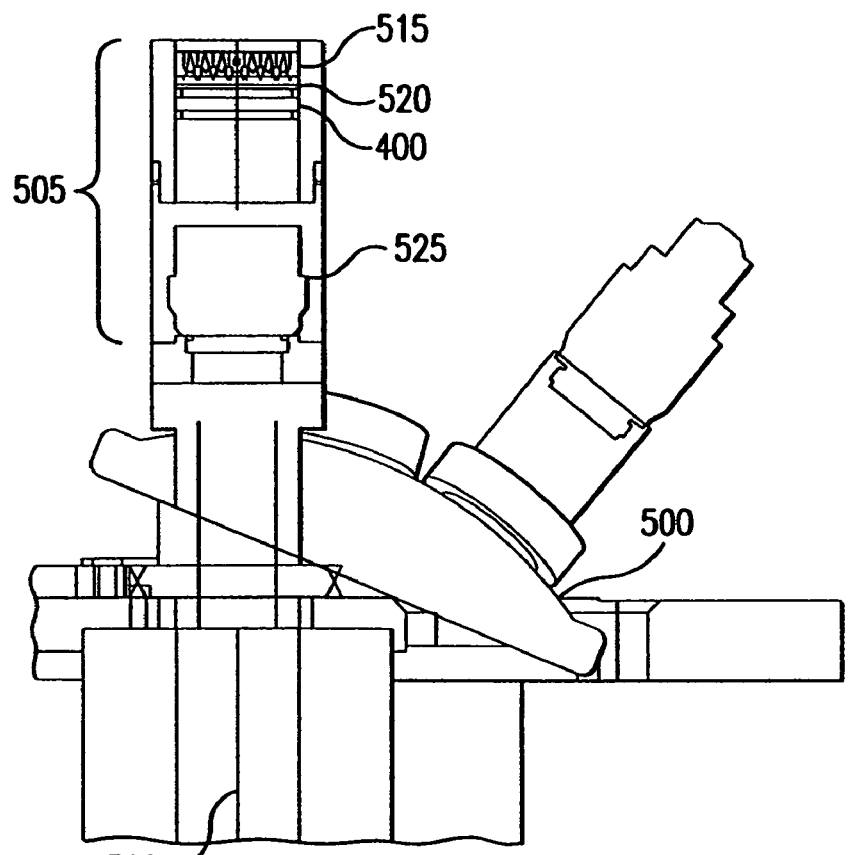
FIG. 5 is a schematic view of an optical turret of a PICA system having a prior-art calibration assembly.
Figure 6:
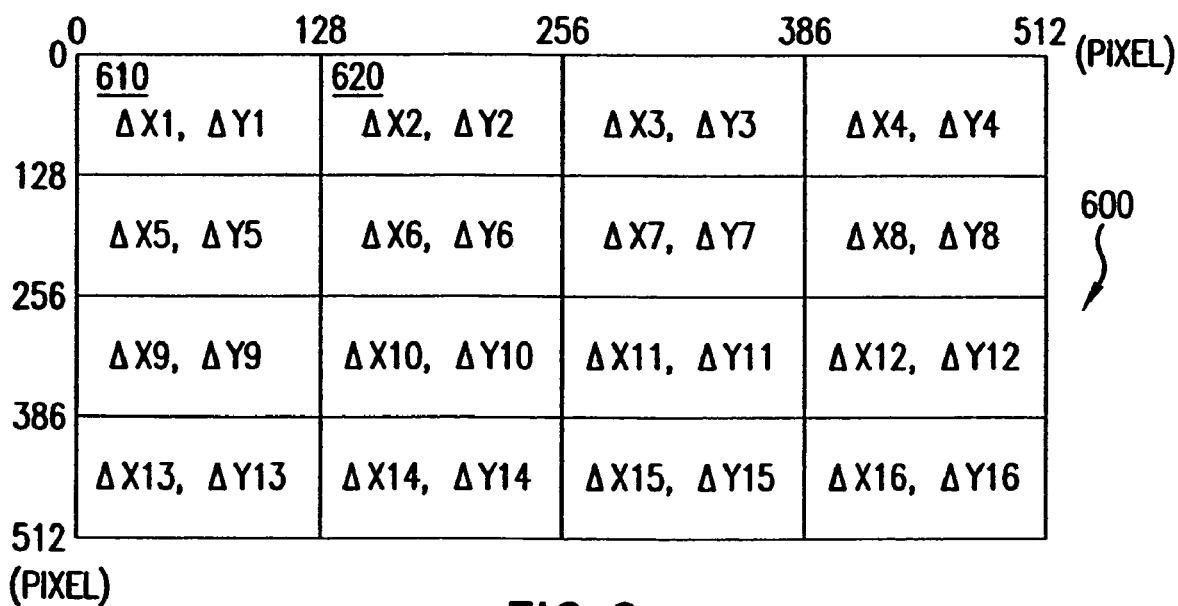
FIG. 6 shows a prior-art correction matrix.
Figure 7:
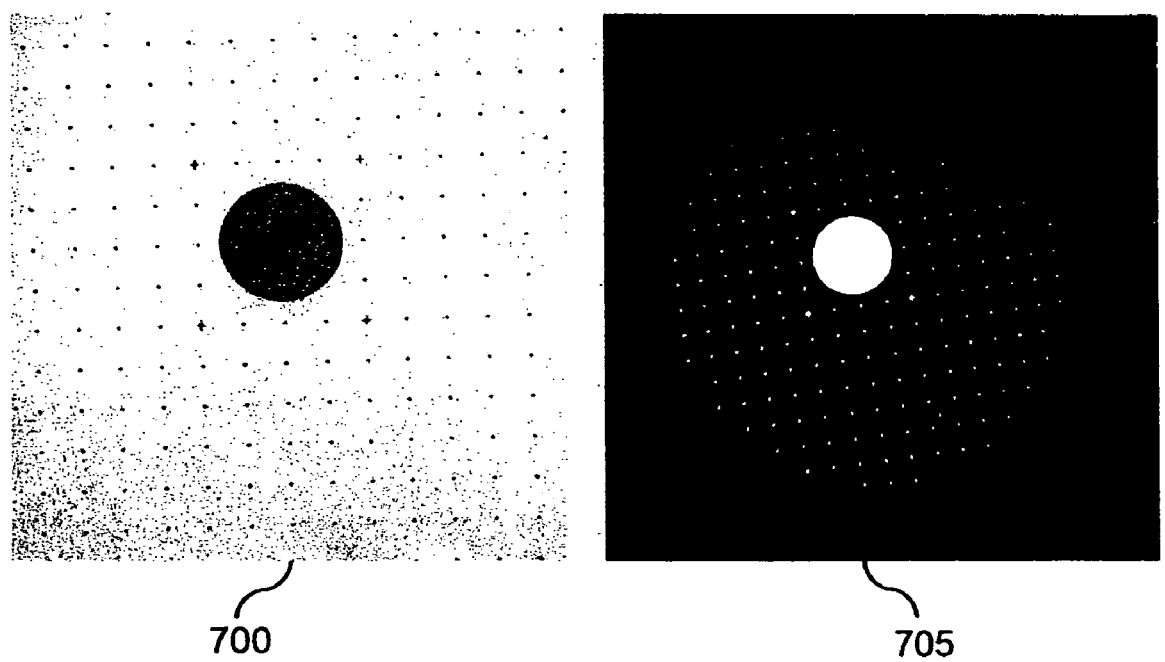
FIG. 7 shows an LSM image and a PICA image of a calibration reticle.
Figure 15:
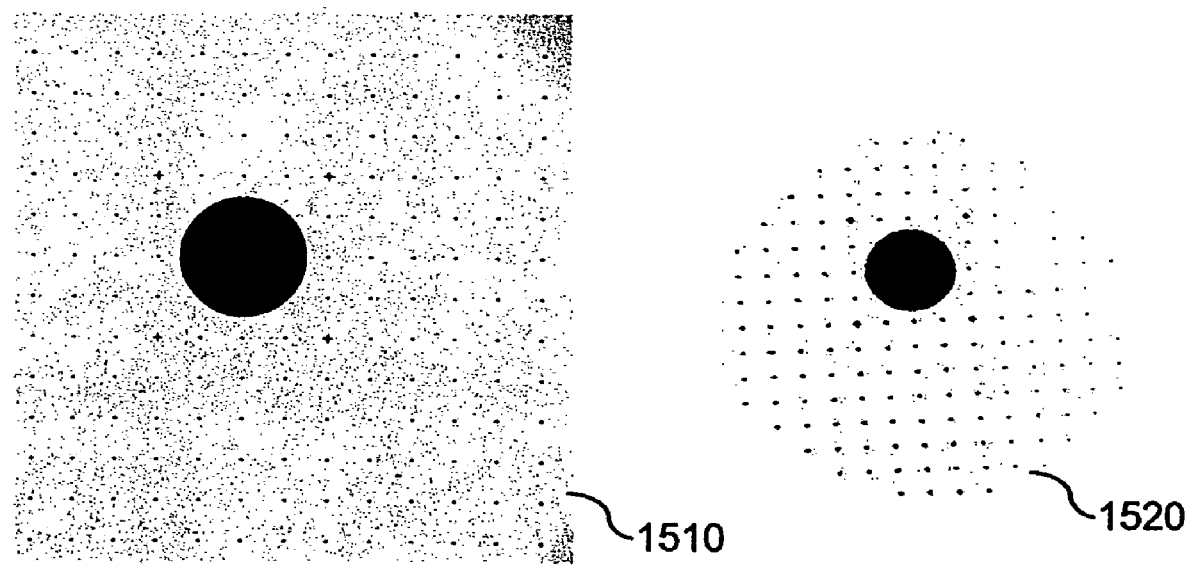
FIG. 15 shows an LSM image and a PICA image of a calibration target.

The LSM image and PICA emission image are acquired through two different optical paths and with two different detectors. Only the objective is common to the two sensors as the first part of the optical system until the deflecting mirror 135. The resistive anode in the PICA detector of camera 140 is not linear in position measurement due to non-uniform thickness and edge effects. These physical differences lead to strong dissimilarities between the two images. FIG. 15 shows an LSM image 1510 and a PICA image 1520 of a calibration target as in FIG. 4, in which PICA image 1520 is mainly translated and rotated compared to LSM image 1510. Calibration is needed to measure and compensate the variations.

Detector Calibration Overview

The LSM image is used for navigation on the DUT and will be defined as the reference image. A reticle, consisting of a series of apertures at a precise separation, is used to do the calibration. The reticle can have the pattern shown in FIG. 4 or can be of other design suitable to the purpose. This calibration is needed just once after the set up of the machine. In general there is no need to calibrate before each acquisition except if the instrument has been moved.

An image-processing algorithm locates the position of each aperture in the emission data, which is then mapped against its expected position based on the LSM reference image to create a correction matrix. The positions of emission data from the DUT in real acquisition are then corrected using the matrix.

Figure 16:
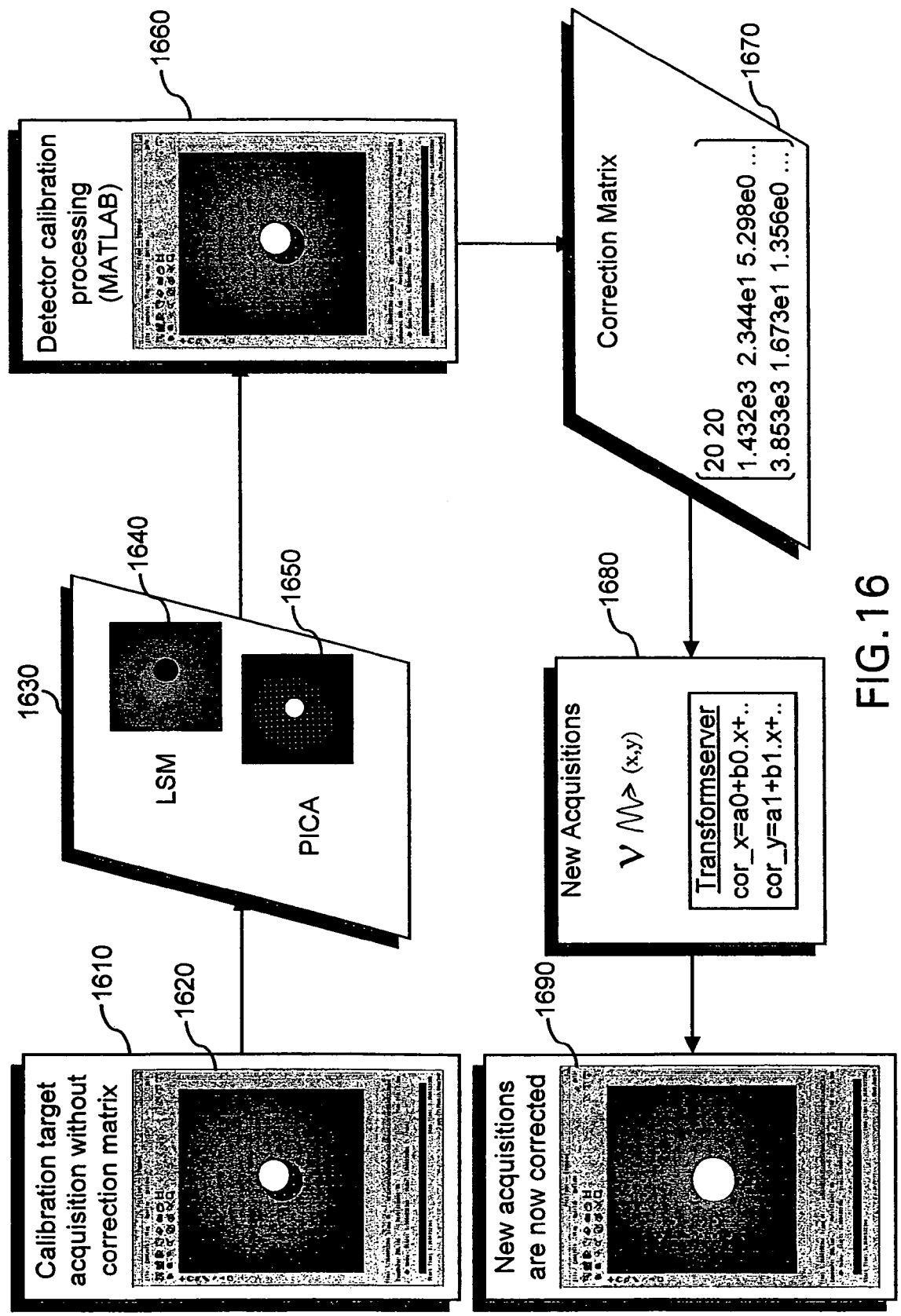
FIG. 16 shows an overview of the principal operations in detector calibration and subsequent image acquisition in accordance with the invention.
Figure 17:
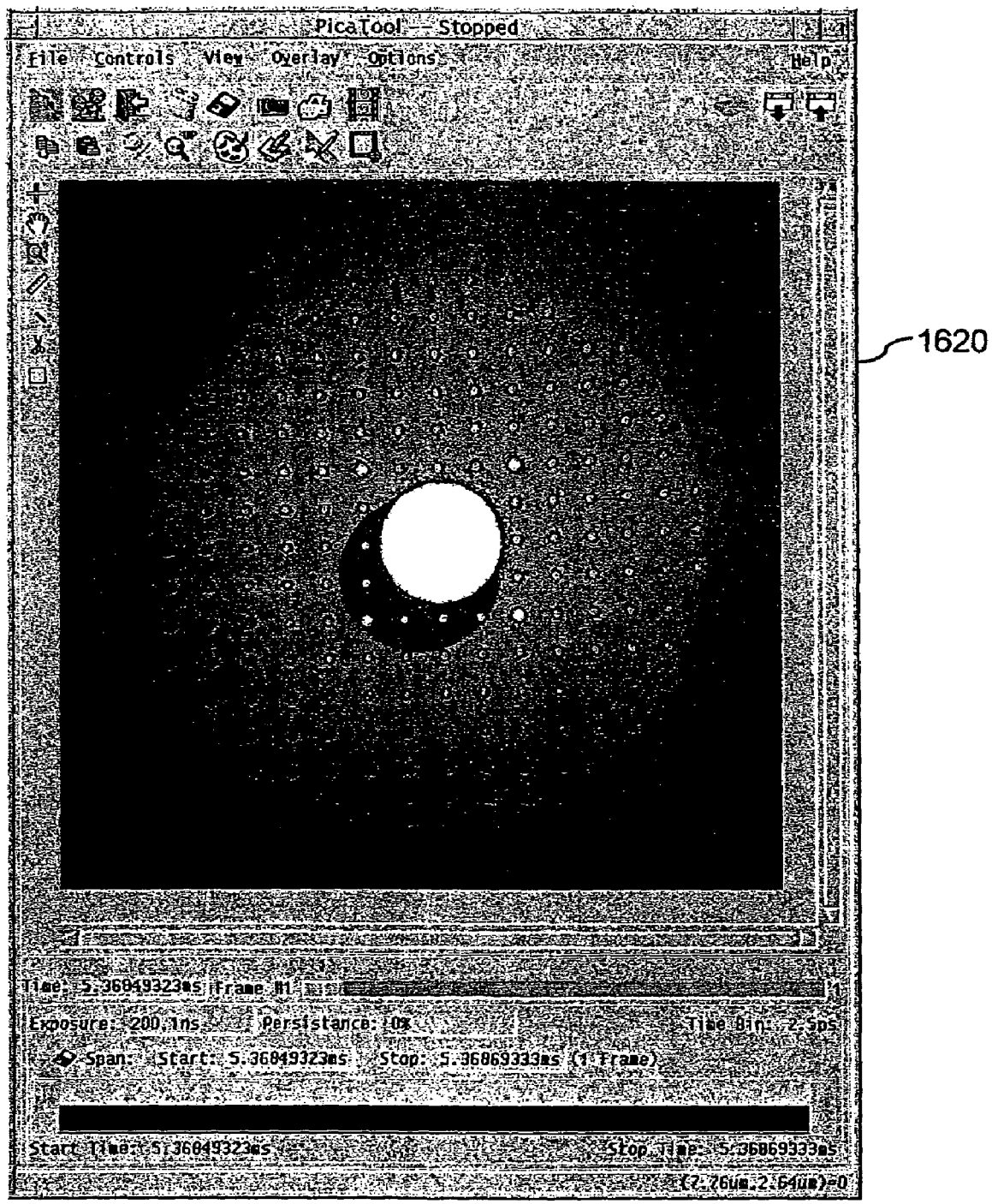
FIG. 17 is a screen display of a PICA image and an LSM image overlaid to show misregistration.

FIG. 16 shows an overview of the principal operations in detector calibration and subsequent image acquisition. At 1610, an LSM image and a PICA image of the calibration target are acquired without applying a correction. Before starting this acquisition, any prior correction matrix stored in the system is erased or disabled. The images are shown overlaid in a screen display 1620 in which the misregistration is evident (screen display 1620 is shown enlarged in FIG. 17). This acquisition produces data files 1630 of the raw LSM image 1640 and PICA image 1650, e.g., in TIFF format without any compression. At 1660, a detector calibration software tool (xdetcal) running on workstation 200 computes the appropriate correction matrix. A new file 1670 containing the computed correction matrix is stored for later use when acquiring images of a DUT 120.

At 1680, computation of the corrected position of photon detection events is done in transform server 230 as the PICA emission data is acquired, in real time. That is, the correction is applied during the acquisition on each incoming photon. This is not a global correction applied to the whole image at the end of the acquisition. The result is a corrected PICA image which is aligned with the LSM image, as shown in the screen display at 1690. How the position is corrected is explained below with reference to the flow charts of FIG. 18 and FIG. 19.

Figure 18:
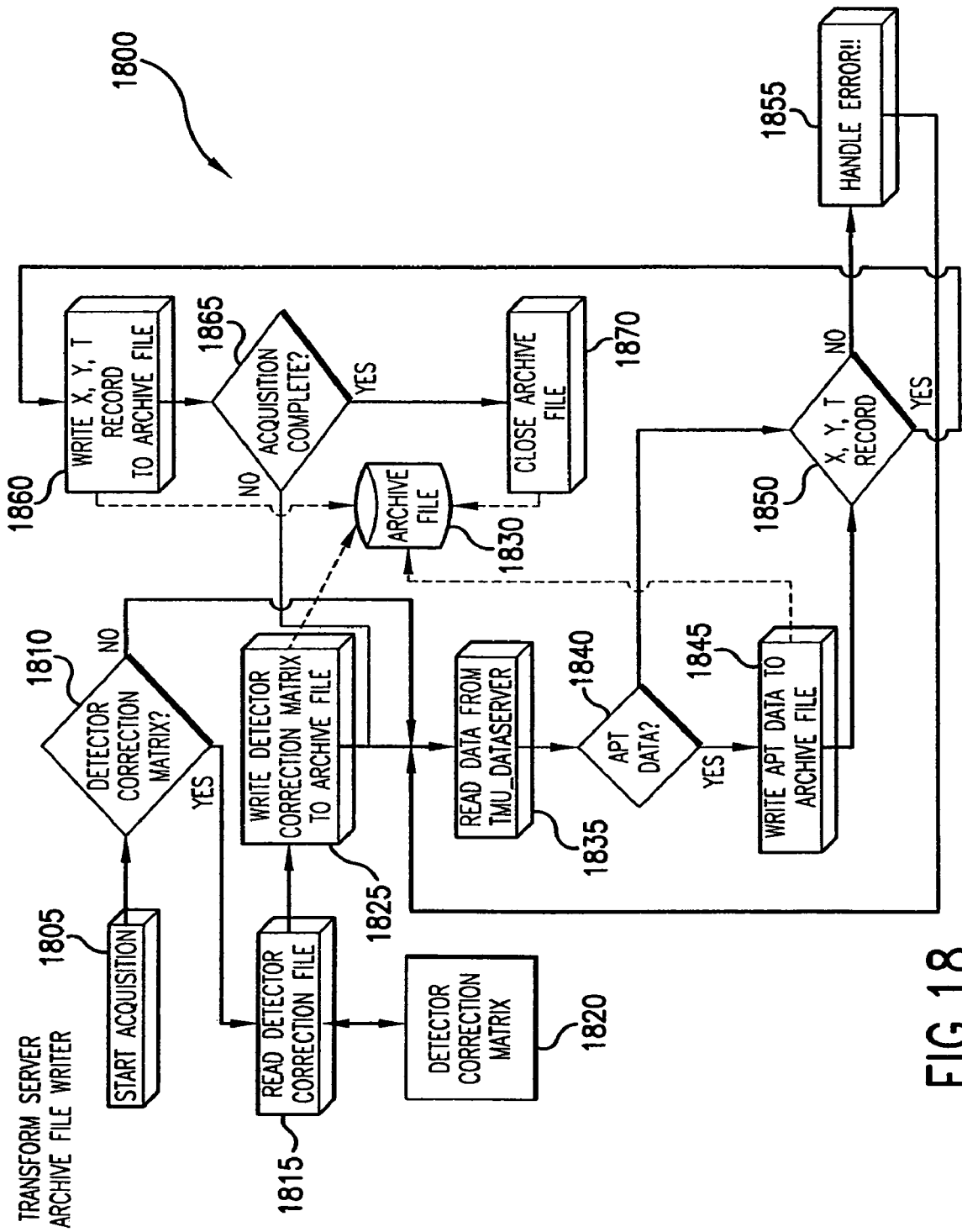
FIG. 18 is a flow chart showing the archive-file writer in transform server 230 in accordance with the invention.

FIG. 18 is a flow chart showing at 1800 the archive-file writer in transform server 230. Acquisition begins at 1805. A check is made at 1810 for a detector correction matrix. If a detector correction matrix file 1815 is found, it is read at 1820 and the detector correction matrix is written at 1825 to an archive file 1830. Processing continues at 1835 by reading data from the TMU data server 220. The data is checked at 1840 to see if it is Automatic Probe Tracking (APT) data. APT data is data describing an image patch which is used to compensate for time-varying x,y drift in the IDS® PICA system; an image patch is acquired from time to time and compared with an earlier-acquired patch to determine what compensation, if any, is to be applied for x,y drift. If the data is APT data, it is written at 1845 to archive file 1830. Processing continues at 1845 by checking whether the data is an X,Y,T record representing a photon-detection event. If not, error-handling occurs at 1855 and control passes to 1835 to read further data from TMU data server 220. If the data is found at 1850 to be an X,Y,T record representing a photon-detection event, then the X,Y,T record is written at 1860 to archive file 1830. A check is made at 1865 to see if the acquisition is complete. If yes, the archive file 1830 is closed at 1870. If no, control passes to 1835 to read further data from TMU data server 220.

Figure 19:
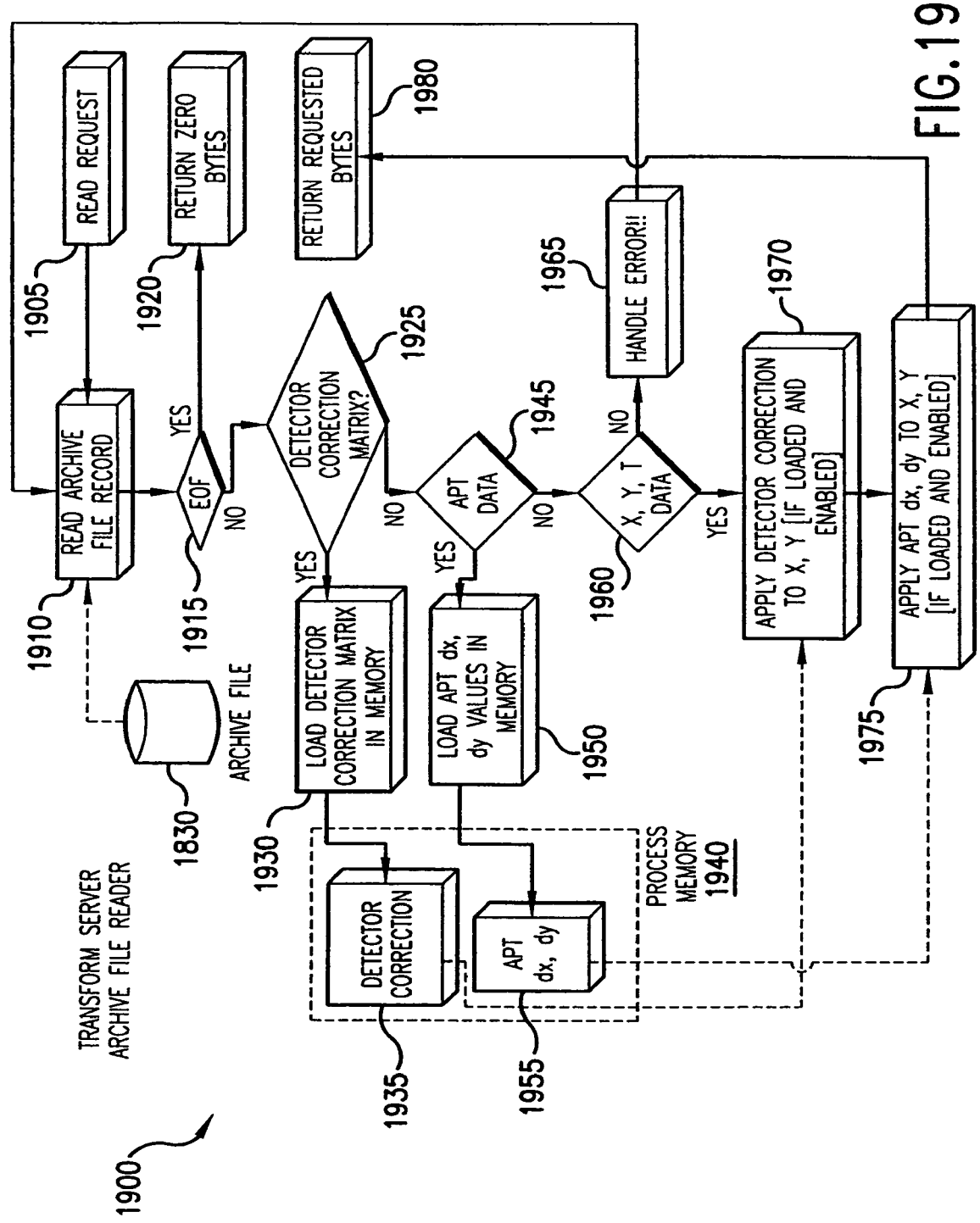
FIG. 19 is a flow chart showing the archive file reader in transform server 230 in accordance with the invention.

FIG. 19 is a flow chart showing at 1900 the archive file reader in transform server 230. When a read request is received at 1905, a record is read at 1910 from archive file 1830. A check is made at 1915 whether the record is the end of file (EOF). If yes, zero bytes are returned at 1920. If no, a check is made at 1925 whether the record represents a detector-correction matrix. If yes, the detector-correction matrix is loaded at 1930 into a portion 1935 of process memory 1940 of workstation 200. If no, a check is made at 1945 whether the record represents APT data. If yes, the APT dx,dy offset values are loaded at 1950 into a portion 1955 of process memory 1940. A check is made at 1960 whether the record represents X,Y,T data of a photon-detection event. If no, an error-handling occurs at 1965 and control passes to 1910 to reach a further archive-file record. If yes, and if a detector-correction matrix is loaded in portion 1935 of process memory 1940 and enabled, the appropriate detector correction is applied to the X,Y,T data at 1970. If APT dx,dy offset values are loaded in portion 1955 of process memory 1940 and enabled, they are applied to the X,Y data at 1975. The bytes requested in the read request at 1905, corrected at 1970 with the correction matrix and at 1975 with APT offsets as appropriate, are returned at 1980.

Detector Calibration Processing

Common features are identified in the LSM image and the PICA image. Embodiments of the present invention are based on the use of defined control points corresponding to the regularly spaced apertures of a reticle such as reticle 400. In a first processing part the blobs in the LSM image and the PICA image are identified and precisely located. The images are converted to binary images using an adequate thresholding level. Then for each blob in the LSM image, its matching blob, if present in the PICA image, is associated.

Figure 20:
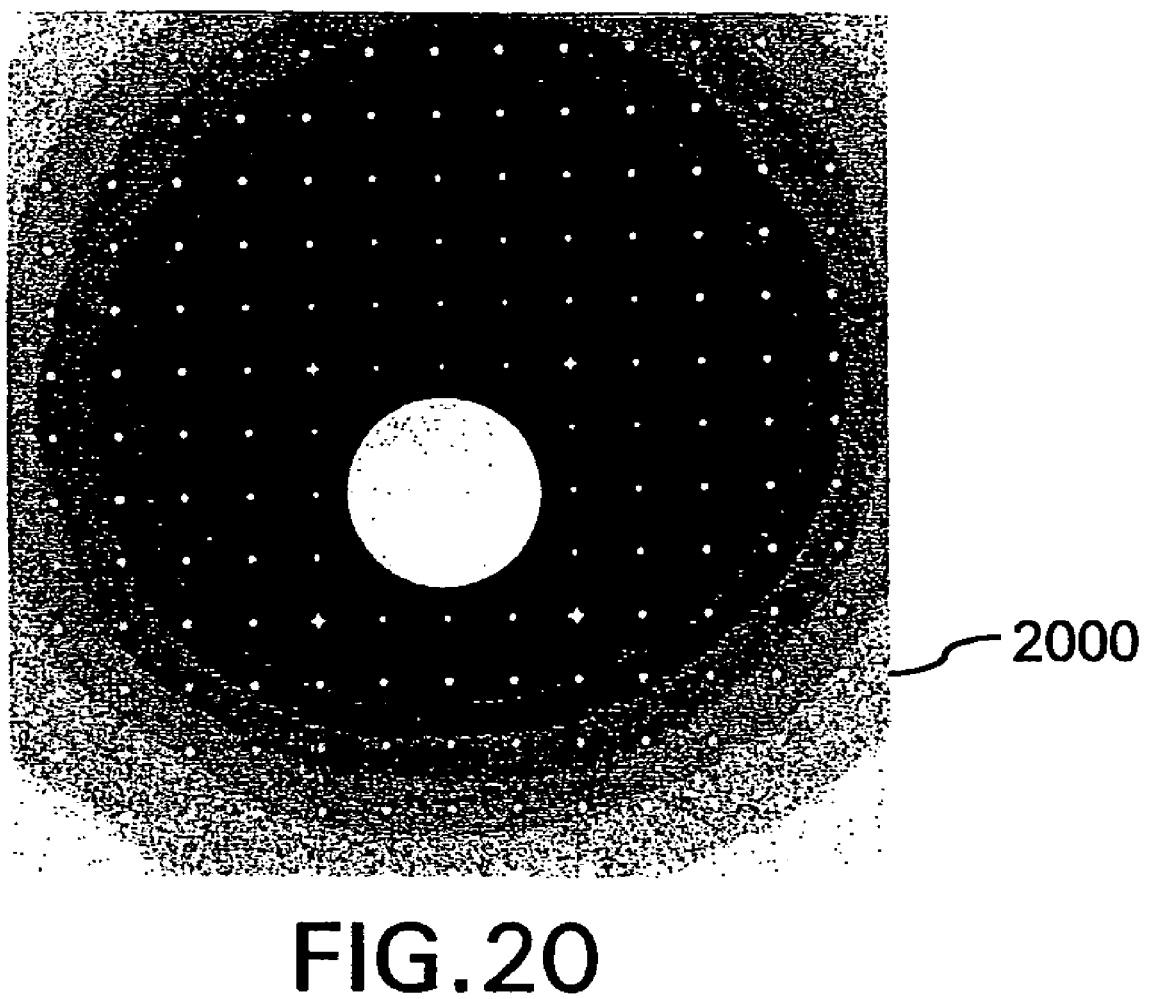
FIG. 20 shows an LSM image having strong intensity gradients.
Figure 21:
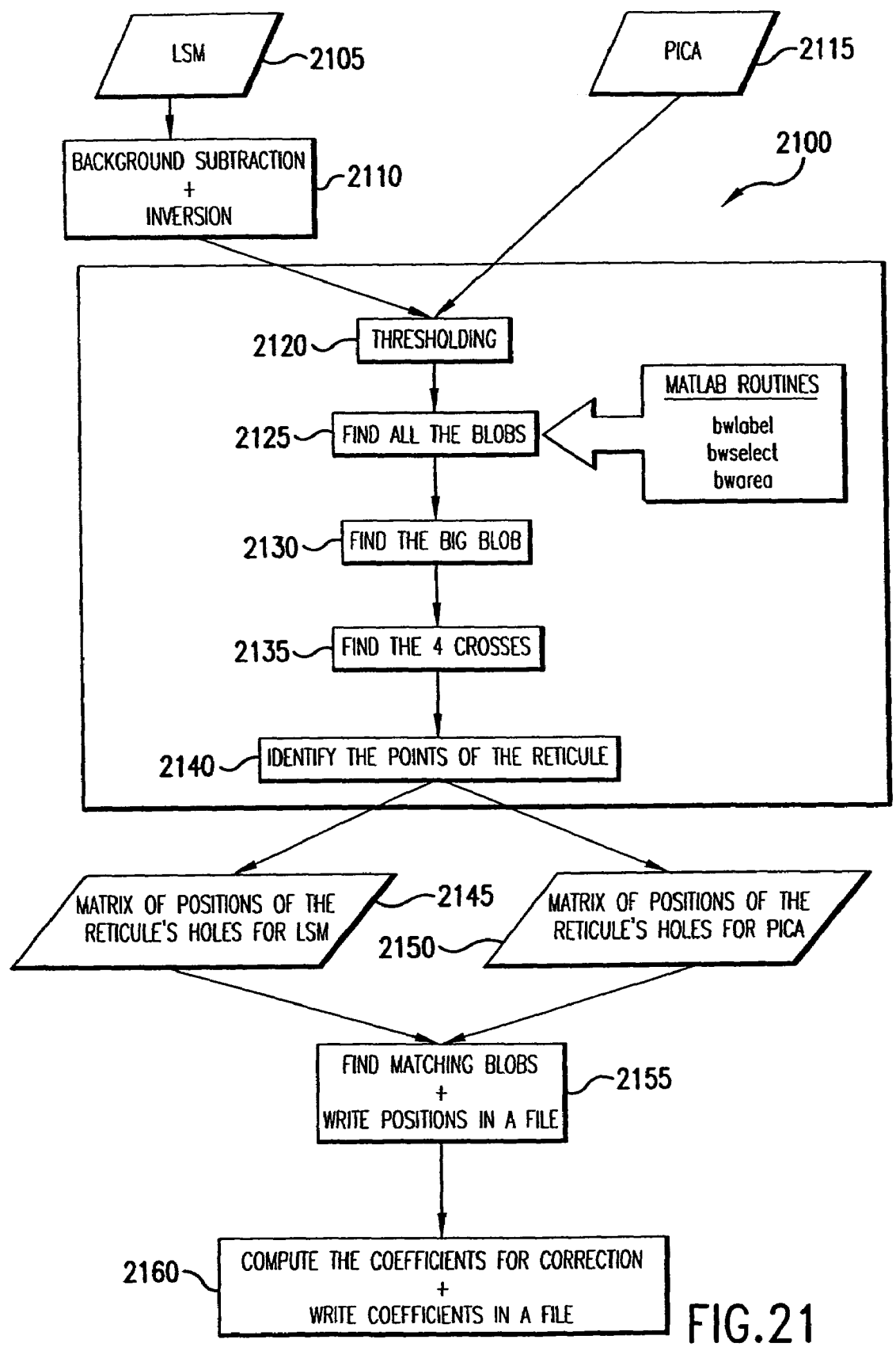
FIG. 21 is a flow chart of PICA detector calibration in accordance with the invention.

This processing is shown at 2100 in the flow chart of FIG. 21. LSM image 2105 is processed at 2110 by subtracting background and inverting the image. Background subtraction is used because, in some cases, the LSM image has strong intensity gradients, as shown in the LSM image 2000 of FIG. 20. When strong intensity gradients are present, thresholding cannot be done correctly. The background of the LSM image is evaluated by deleting the little blobs by gray scale erosion. The big structure due to the center hole of the reticle remains in the image due to its big size. This resulting background image is then subtracted from the grayscale LSM image. The result is a flatter image (less intensity gradient) from which the blobs can be extracted by thresholding. Thresholding gives an empty region inside the center hole structure which can be artificially filled with a binary processing routine.

Figure 8:
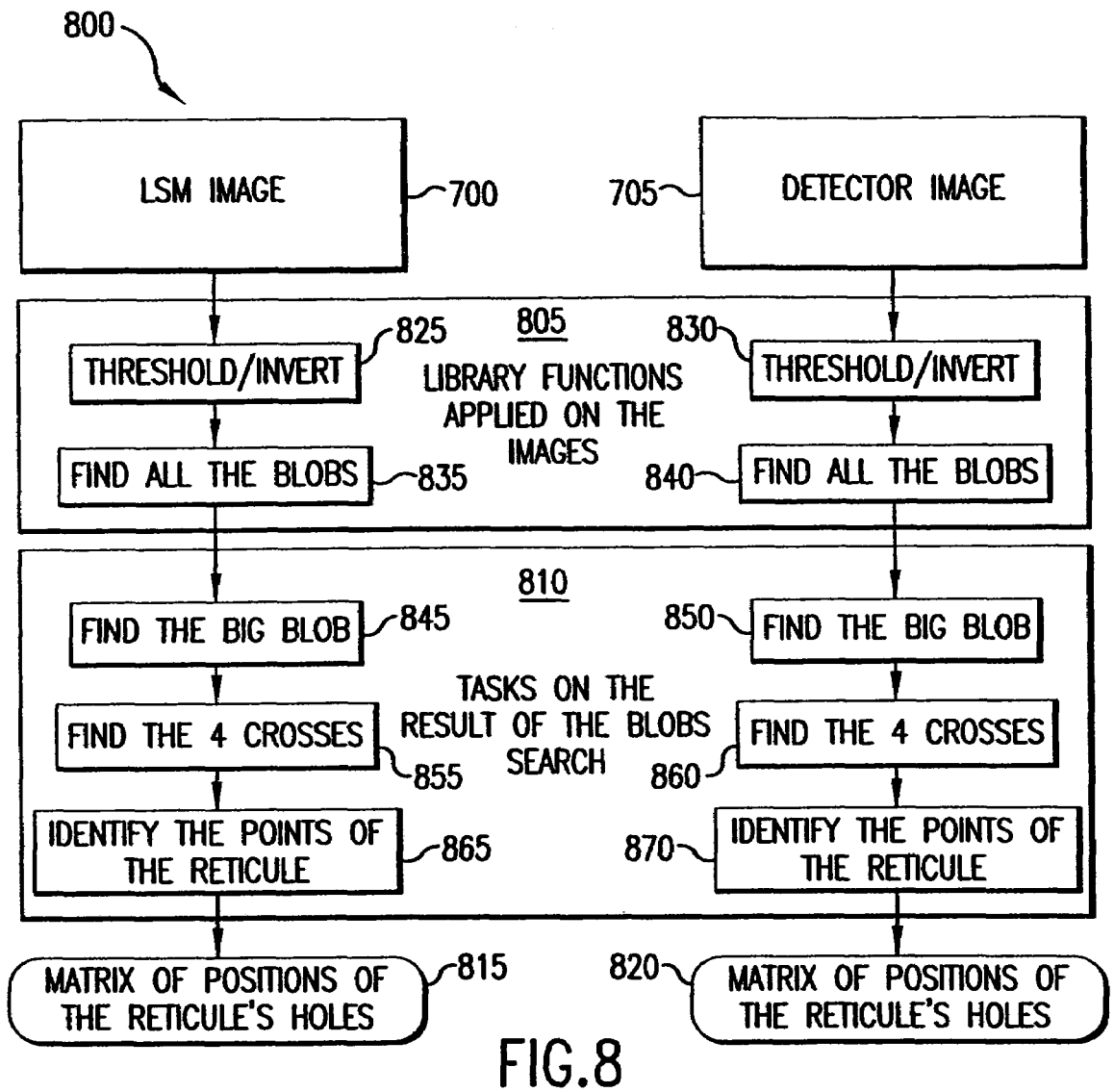
FIG. 8 shows a first stage of building a position-correction matrix in accordance with the prior art;.
Figure 9:
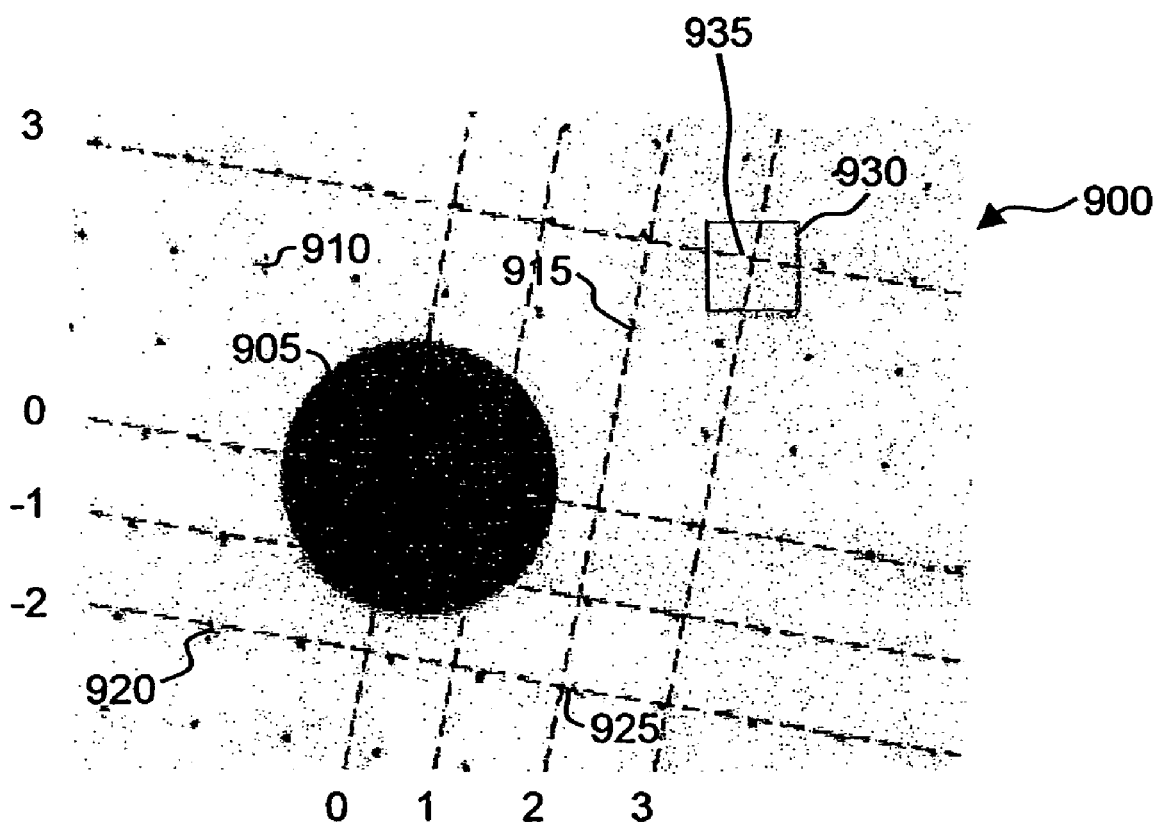
FIG. 9 shows a grid system overlaid on a PICA image in accordance with the prior art.
Figure 10:
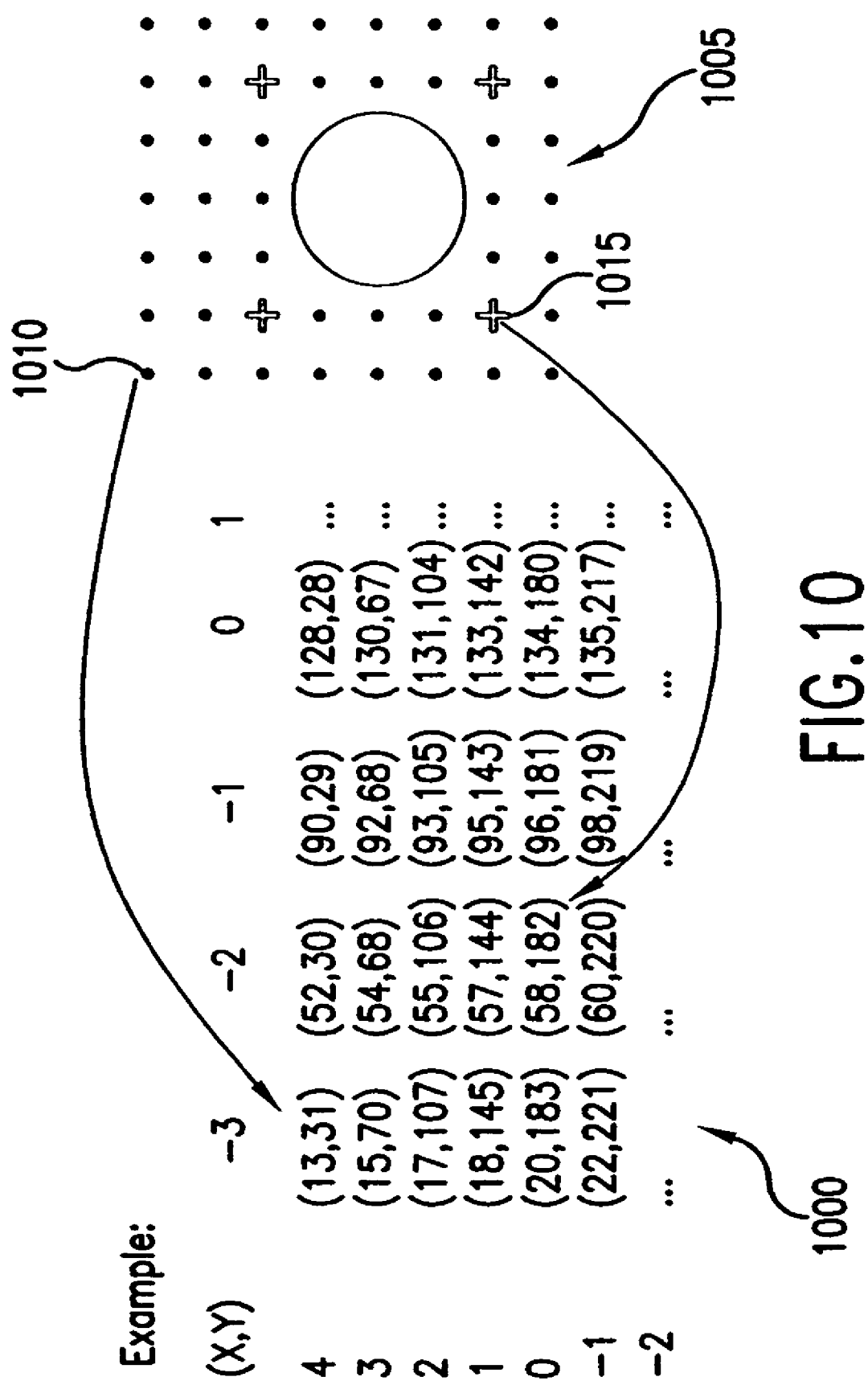
FIG. 10 shows a portion of a grid-point location matrix along with an image region in accordance with the prior art.
Figure 11:
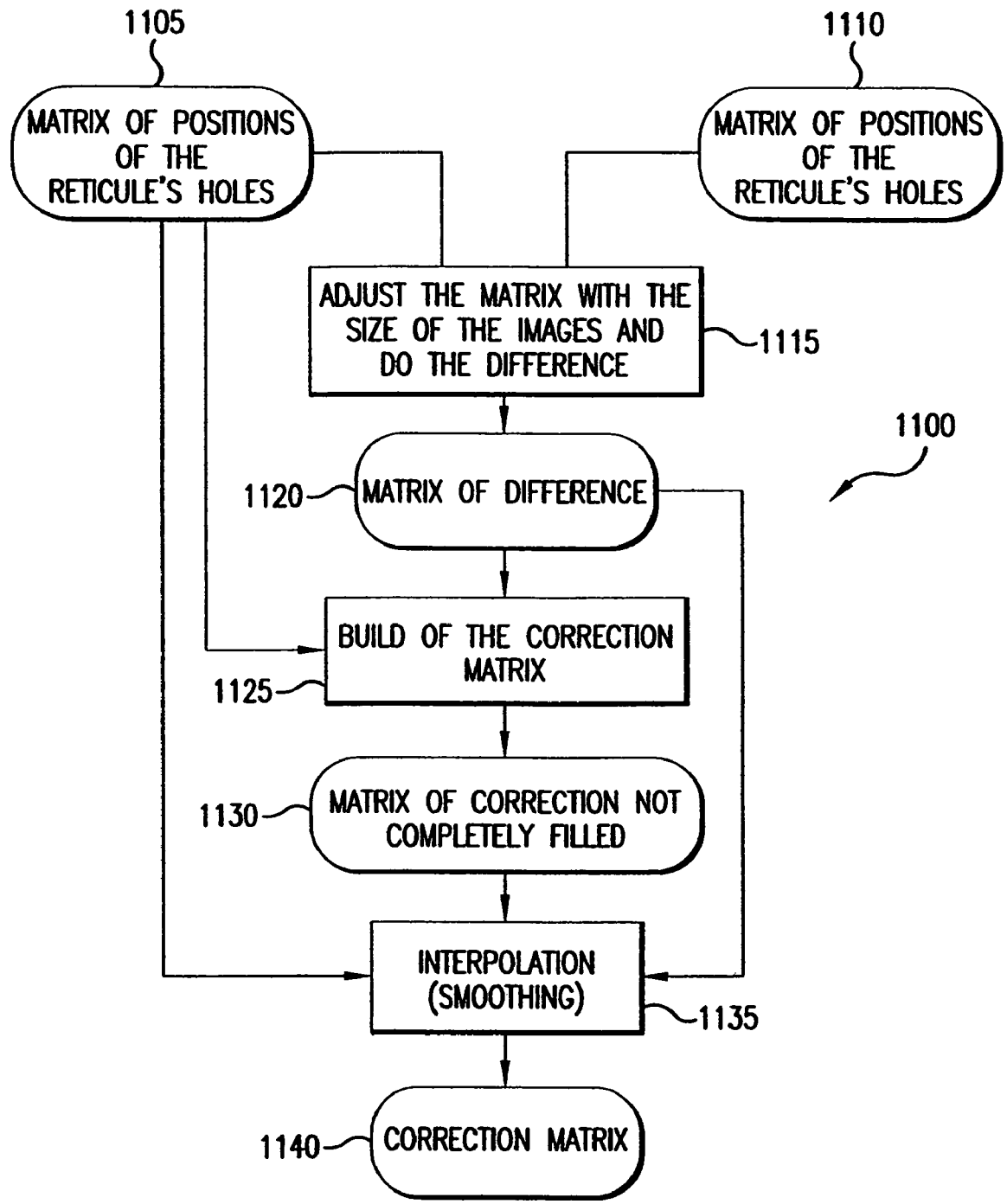
FIG. 11 shows a second stage of building a correction matrix in accordance with the prior art.
Figure 12:
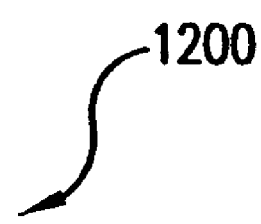
FIG. 12 shows a linear interpolation relationship in accordance with the prior art.
Figure 13:
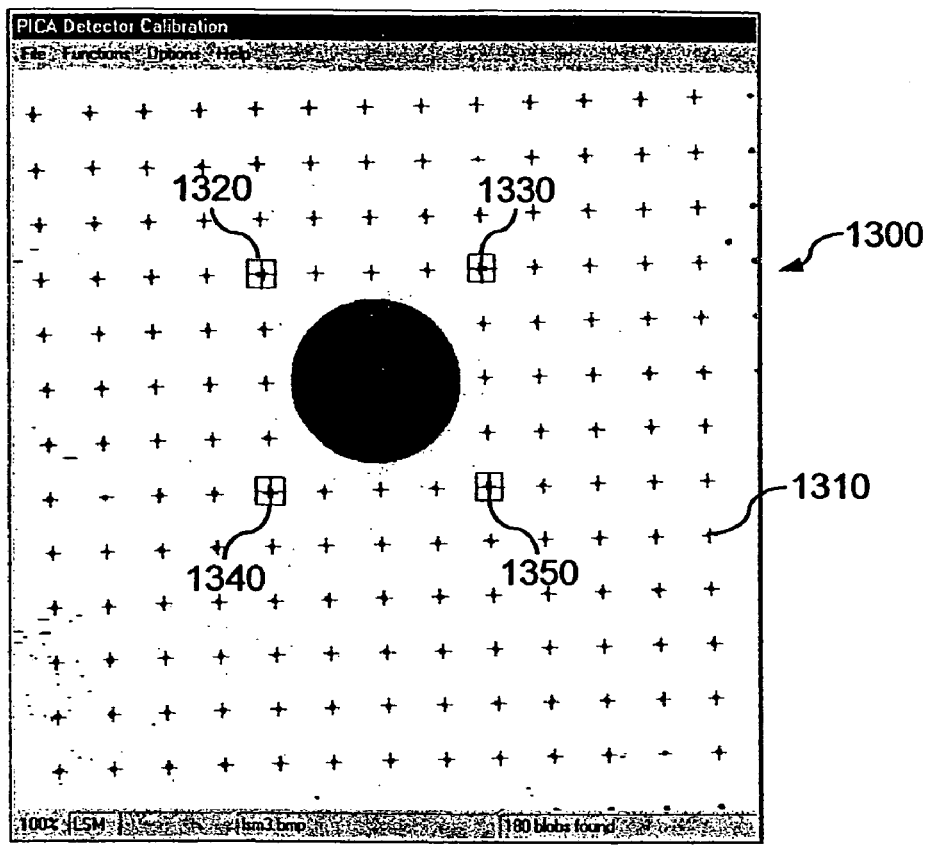
FIG. 13 is a screen display showing detection of reticle points in accordance with the prior art.
Figure 14:
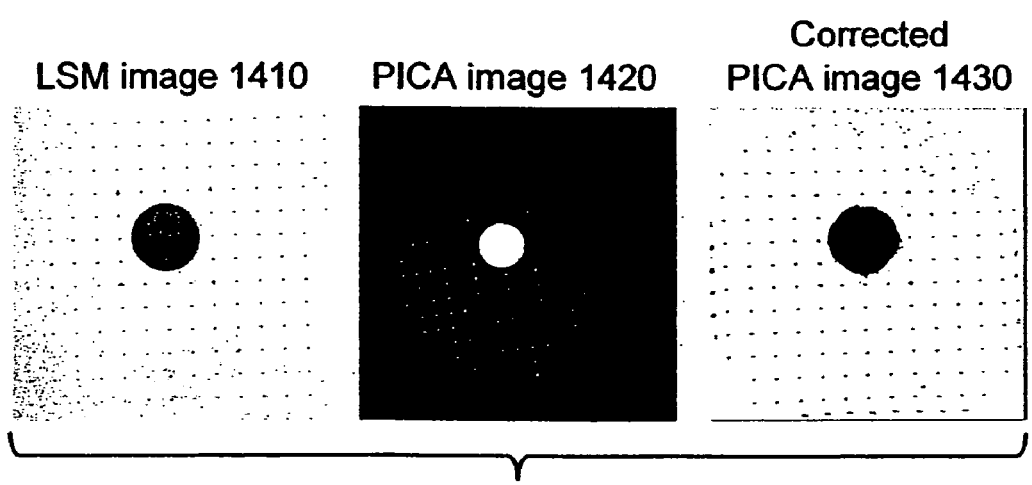
FIG. 14 shows an example of an LSM reticle image, a PICA reticle image and a processed PICA image modified using a correction matrix in accordance with the prior art.

The processing of FIG. 21 is otherwise similar to that of the prior-art method of FIG. 8. The LSM image 2105 (after background subtraction and inversion at 2110) and the PICA image 2115 are thresholded at 2120. The blobs are located in each image at 2125, e.g., using MATLAB routines bwlabel, bwselect and bwarea. The big blob is identified at 2130, e.g., as having the largest area. The four crosses are located at 2135, e.g., as having intermediate-sized area and by their proximity to the big blob. The grid-points of the reticle are located at 2140 by searching a region around their expected positions. The result is a matrix 2145 of positions of the reticle's holes in the LSM image and a matrix 2150 of positions of the reticle's holes in the PICA image. The blobs of the matrices 2145, 2150 are matched at 2155 and the positions are written to a file. Correction coefficients are computed at 2160 and the coefficients are written to a file.

Computing Correction Coefficients

Computing correction coefficients in accordance with embodiments of the invention will now be described. A first embodiment is based on a local correction: coefficients are found for a bilinear equation that gives the transformation of a rectangle formed by four blobs in the PICA image to fit its associated rectangle in the LSM image. An extrapolation of these coefficients for the rectangles at the outer edges of the image is done where there is no identified blob in the PICA image. For the matching rectangle in the emission image, if there are M points inside this rectangle, the corrected coordinates (cx,cy) for the $n^{th}$ point can be expressed in function of the observed coordinates (x,y) using the following equations:

$$cx_n = a_{i0} + a_{i1}x_n + a_{i2}y_n + a_{i3}x_ny_n$$
$$cy_n = b_{i0} + b_{i1}x_n + b_{i2}y_n + b_{i3}x_ny_n$$ for $n = 1, M$ As the corrected coordinates are in fact the coordinates in the LSM image, the system above can be resolved and the ($a_{ij}$, $b_{ij}$) coefficients found for each rectangle are stored in a file.

Figure 22:
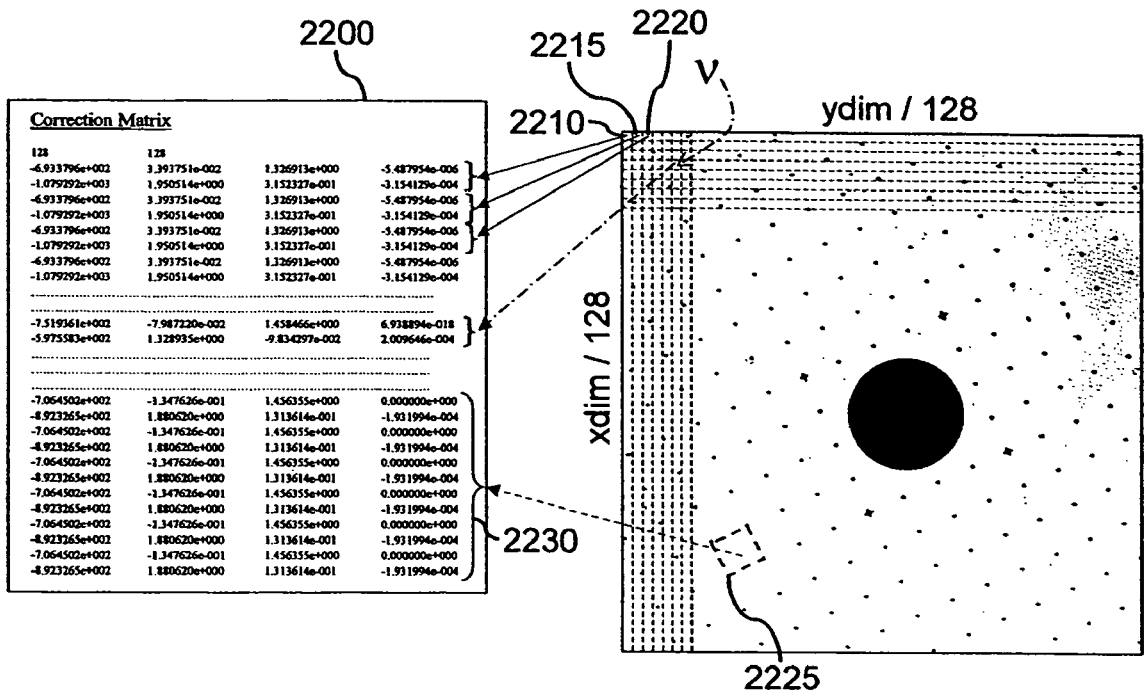
FIG. 22 shows the structure of a correction data file in accordance with an embodiment of the invention.

FIG. 22 shows the structure of an exemplary correction file 2200 and the relationship of its elements to an image 2210. In this example, the image is divided into 128*128 squares, such as squares 2210, 2215, 2220. For each square, there is a corresponding set of coefficients in the correction matrix, one line for x and one line for y in this example. All the elementary squares contained in a rectangle formed by four points of the reticle (such as rectangle 2225) will have the same coefficients (such as at 2230) which described the transformation of this rectangle in the PICA image to fit the same one in the LSM image. The position of a photon-detection events arriving in an elementary square will be corrected using the coefficients corresponding to this square.

A second embodiment for computing correction coefficients is based on a global correction. Global transformations impose a single mapping function on the whole image. The general model for characterizing misregistration between two images is a pair of bivariate polynomials. The coefficients of the polynomials are adjusted using all the matching blobs in both images. Polynomials of degree one or more can be used.

Polynomials of degree one are sufficient for correcting shift or rotation, but is not adequate for correcting distortion. Polynomials of degree two are sufficient to model most of the usual deformations such as scale, shift and rotation. Polynomials of degree three or more will correct for distortion, though degree four or more has been found to introduce noise. This method avoids the need for extrapolation anymore and is much less time-consuming.

The corrected coordinates are linked with the observed ones by the following polynomial equations:

$$cx = \sum_{p=0}^{N}\sum_{q=0}^{N-p} a_{pq}x^py^q$$

$$cy = \sum_{p=0}^{N}\sum_{q=0}^{N-p} b_{pq}x^py^q$$

where N is the degree of the polynomial

The coefficients here are unique for the whole image and will be applied over each "pixel". Using the fact that the corrected coordinates are the coordinates in the LSM image, the system is resolved and a unique set of correcting coefficients is determined. The accuracy of the calibration depends on the image quality (signal-to-noise ratio). The signal-to-noise ratio must be high enough to well-identify all blobs in both the LSM image and in the PICA emission data. The appropriate thresholding level is a compromise between the reduction of the noise in the image and no loss of weak blobs. As constraints are applied in the process of blob identification, some residual ghosts in the image do not affect the result. Global correction is more robust than the local one and is not sensitive to missing points, for example at the edges or because of some detector defects.

Figure 23:
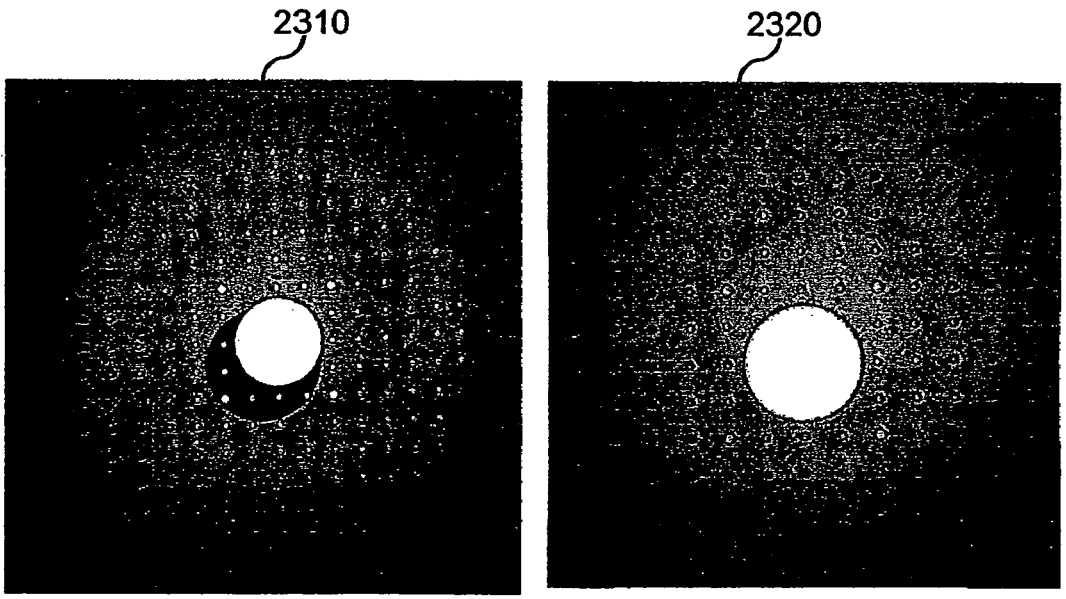
FIG. 23 shows an overlay of an uncorrected PICA image and an LSM image showing misregistration and an overlay of a PICA image corrected in accordance with the invention and an LSM image.

The correction coefficients are applied by the transform server 230 to correct the observed positions of the detected photons in real-time acquisition. FIG. 23 shows at 2310 an overlay of an LSM image and a PICA image without correction, and at 2320 with global correction in accordance with the invention.

An error analysis gives a comparison of the two techniques just described. The criteria used for evaluation of the registration accuracy is the root mean square distance error (criteria used in geometrical registration of images in remote sensing data). The quality of the registration can be expressed as:

$$RMSDE = \sqrt{\frac{1}{N}\sum_{i=1}^{N} \text{line\_residual}\,[i]^2 + \text{column\_residual}\,[i]^2}$$

in which N is the total number of ground control points (GCP).

A calibration acquisition was used and the emission data was corrected using both methods. Then the matching blobs were found again in the corrected emission data and compared to those in the LSM image. The experimental results for the local correction (matrix) and the global correction (polynomial) are given in the following table:

| Correction Method | Number of GCP | RMSDE (pixel) |
|---|---|---|
| Local | 148 | 1.2357 |
| Global | 148 | 0.9444 |

It appears from these results that the global correction is of good quality and somewhat more accurate than the local one.

As used herein, data processing equipment is intended to include hardware elements, including for example a processor with associated memory and other storage and input/output and display devices, as well as software elements including an operating system and instructions for carrying out the described processing. An optical image includes but is not limited to an LSM image, and is intended to cover images acquired using wavelengths other than infrared, light sources other than laser, and microscopy techniques other than confocal.

The invention is not limited to the embodiments described. Those of skill in the art will recognize that these and other modifications can be made within the spirit and scope of the invention as defined in the claims.

The invention claimed is:

1. A method of correcting PICA image data, comprising:
   a. Acquiring optical image data of a target having identifiable optical-image features,
   b. Acquiring PICA image data of the target having identifiable PICA-image features corresponding to the optical-image features,
   c. Preparing optical-image-background data by applying gray-scale erosion to the optical-image data,
   d. Subtracting optical-image-background data from the optical-image data to produce flattened-optical-image data have lesser intensity gradients than the optical-image data,
   e. matching PICA-image features with corresponding features of the flattened-optical-image data, and
   f. Calculating from matched PICA-image features and optical-image features a set of coefficients defining relationships between observed positions of PICA-image features and optical-image features.

2. An apparatus for preparing corrected PICA image data, comprising:
   a. An optical microscope for acquiring optical image data of a target having identifiable optical-image features,
   b. A PICA camera for acquiring PICA image data of the target having identifiable PICA-image features corresponding to the optical-image features, and
   c. Data processing equipment having instructions for matching PICA-image features with corresponding optical-image features by,
      Preparing optical-image-background data by applying gray-scale erosion to the optical-image data,
      Subtracting optical-image-background data from the optical-image data to produce flattened-optical-image data having lesser intensity gradients than the optical-image data, and
      Matching PICA-image features with corresponding features of the flattened-optical-image data,
   and calculating from matched PICA-image features and optical-image features a set of coefficients defining relationships between observed positions of PICA-image features and optical-image features.

* * * * *